US010200032B2

United States Patent
Lilienthal et al.

(10) Patent No.: US 10,200,032 B2
(45) Date of Patent: Feb. 5, 2019

(54) OPTOELECTRONIC SAFETY DEVICE

(71) Applicant: FRABA B.V., SG Heerlen (NL)

(72) Inventors: Christian Lilienthal, Cologne (DE); Omar Al Attar, Herzogenrath (DE)

(73) Assignee: FRABA B.V., SG Heerlen (NL)

( * ) Notice: Subject to any disclaimer, the term of this patent is extended or adjusted under 35 U.S.C. 154(b) by 189 days.

(21) Appl. No.: 15/264,605

(22) Filed: Sep. 14, 2016

(65) Prior Publication Data

US 2017/0077926 A1 Mar. 16, 2017

(30) Foreign Application Priority Data

Sep. 16, 2015 (DE) .................. 10 2015 115 635

(51) Int. Cl.
*H03K 17/78* (2006.01)
*H02H 3/00* (2006.01)

(52) U.S. Cl.
CPC .............. *H03K 17/78* (2013.01); *H02H 3/00* (2013.01)

(58) Field of Classification Search
CPC .................................. H03K 17/78; H02H 3/00
See application file for complete search history.

(56) References Cited

U.S. PATENT DOCUMENTS

| 4,058,735 A | * | 11/1977 | Tippner | ................. H03K 19/14 |
| | | | | 250/551 |
| 8,994,468 B2 | * | 3/2015 | Chien | ...................... H03K 7/08 |
| | | | | 323/205 |
| 2008/0012682 A1 | * | 1/2008 | Kagerer | .................... G01D 3/08 |
| | | | | 340/3.1 |
| 2009/0059989 A1 | * | 3/2009 | Willemin | ................ H01S 5/183 |
| | | | | 372/50.21 |

FOREIGN PATENT DOCUMENTS

| DE | 32 30 903 A1 | 3/1984 | |
| DE | 3230903 A1 * | 3/1984 | ............... G01V 8/12 |
| DE | 10 2004 017 951 A1 | 11/2005 | |
| DE | 102004017951 A1 * | 11/2005 | ............. H04B 10/25 |
| EP | 0 833 287 A1 | 4/1998 | |
| EP | 0833287 A1 * | 4/1998 | ........... G08B 13/183 |

OTHER PUBLICATIONS

Espacenet.com translation of DE102004017951A1 ; Nov. 2005.*

* cited by examiner

*Primary Examiner* — Jared Fureman
*Assistant Examiner* — Michael Warmflash
(74) *Attorney, Agent, or Firm* — Norman B. Thot

(57) ABSTRACT

An optoelectronic safety device for monitoring a machine movement includes an emitter/receiver device, control electronics, an electric line which includes at least two wires to transmit a supply voltage and a control signal, and a device provided so that the supply voltage and the control signal can be transmitted where the at least two wires is a two-wire electric line or, alternatively, a three-wire electric line.

10 Claims, 2 Drawing Sheets

OPTOELECTRONIC SAFETY DEVICE

CROSS REFERENCE TO PRIOR APPLICATIONS

Priority is claimed to German Patent Application No. DE 10 2015 115 635.0, filed Sep. 16, 2015. The entire disclosure of said application is incorporated by reference herein.

FIELD

The present invention relates to an optoelectronic safety device for monitoring a machine movement, comprising an emitter/receiver device and control electronics, wherein an at least two-wire electric line is provided to transmit a supply voltage and a control signal, the line being provided in particular to connect the safety device with a machine control device.

BACKGROUND

Such an optoelectronic safety device may, for example, be a closing edge safety device at a movable machine element, such as a gate or a gate wing, to monitor a danger zone, in particular a movement range of the machine element. It is thereby provided that the machine or gate movement is immediately stopped when the closing edge hits an obstacle. This is conventionally achieved by providing an electric circuit for the voltage supply to the safety device, in particular between the safety device and the machine control device which, as has previously been described, serves to control a drive motor of the movable machine element and to indicate an obstacle by transmitting the control signal or the motor release signal. Such a closing edge safety device has previously been described, for example, in EP 0 833 287 B1 and DE 10 2004 017 951 A1.

For monitoring the danger zone, optoelectronic safety devices have previously been described which comprise a light barrier with a light emitter and a light receiver forming a light signal path in the region of a moving edge of the machine element. Besides the optical coupling between the light emitter and the light receiver, an electric coupling is provided so that a feedback is actually provided between the light emitter and the light receiver. The light receiver sends a dynamic electric signal to the light emitter via an electric connection in response to the dynamic light signal emitted by the light emitter and received by the light receiver. This electric dynamic signal is most often detected by an evaluation unit, and a motor release signal is generated in response to the electric signal with the optoelectronic safety edges currently available on the market. Every failure in the light emitter/light receiver system will result in the absence of the electric dynamic coupling signal which is detected by the evaluating unit and is converted into a correspondingly negative motor release signal. In other words: the motor release signal is dependent on the optical and/or electric signal transmitted between the light emitter and the light receiver.

A line with three electric wires has become the standard for the electric connection to transmit the control signal and to realize an electric circuit for the operating voltage supply of the safety device, wherein typically two of the three wires are used to form the electric circuit and the third wire is used for signal transmission. It is thereby not only possible to provide a relatively undisturbed transmission of the control signal, the power supply to the safety device can also be effected.

In addition to this established type of connection, systems and manufacturers also exist which use an electric line with only two wires as a connection between the safety device and the machine control both for power supply and to transmit a control signal. The control signal and the supply voltage are frequently transmitted in a superposed condition with such connections.

Both of the above described systems require (depending on whether a two-wire or a three-wire connecting line is used) a safety device functional with and adapted to the respective system. A safety device with a three-pole or three wire terminal cannot be coupled with a machine control system having a two-wire terminal and vice versa. Such safety devices must therefore be specifically designed and manufactured for a system with a three-wire connection or for a system with a two-wire connection. Manufacturing and providing two separate safety systems that function almost identically and which merely have different transmission systems is, however, relatively complex and costly.

SUMMARY

An aspect of the present invention is to provide an optoelectronic safety device with an improved applicability and connectivity to a machine control so that the costs for manufacturing, assembly and provisioning can be reduced.

In an embodiment, the present invention provides an optoelectronic safety device for monitoring a machine movement which includes an emitter/receiver device, control electronics, an electric line comprising at least two wires configured to transmit a supply voltage and a control signal, and a device configured so that the supply voltage and the control signal can be transmitted where the at least two wires comprises a two-wire electric line or, alternatively, a three-wire electric line.

BRIEF DESCRIPTION OF THE DRAWINGS

The present invention is described in greater detail below on the basis of embodiments and of the drawings in which.

DETAILED DESCRIPTION

Figure 1:
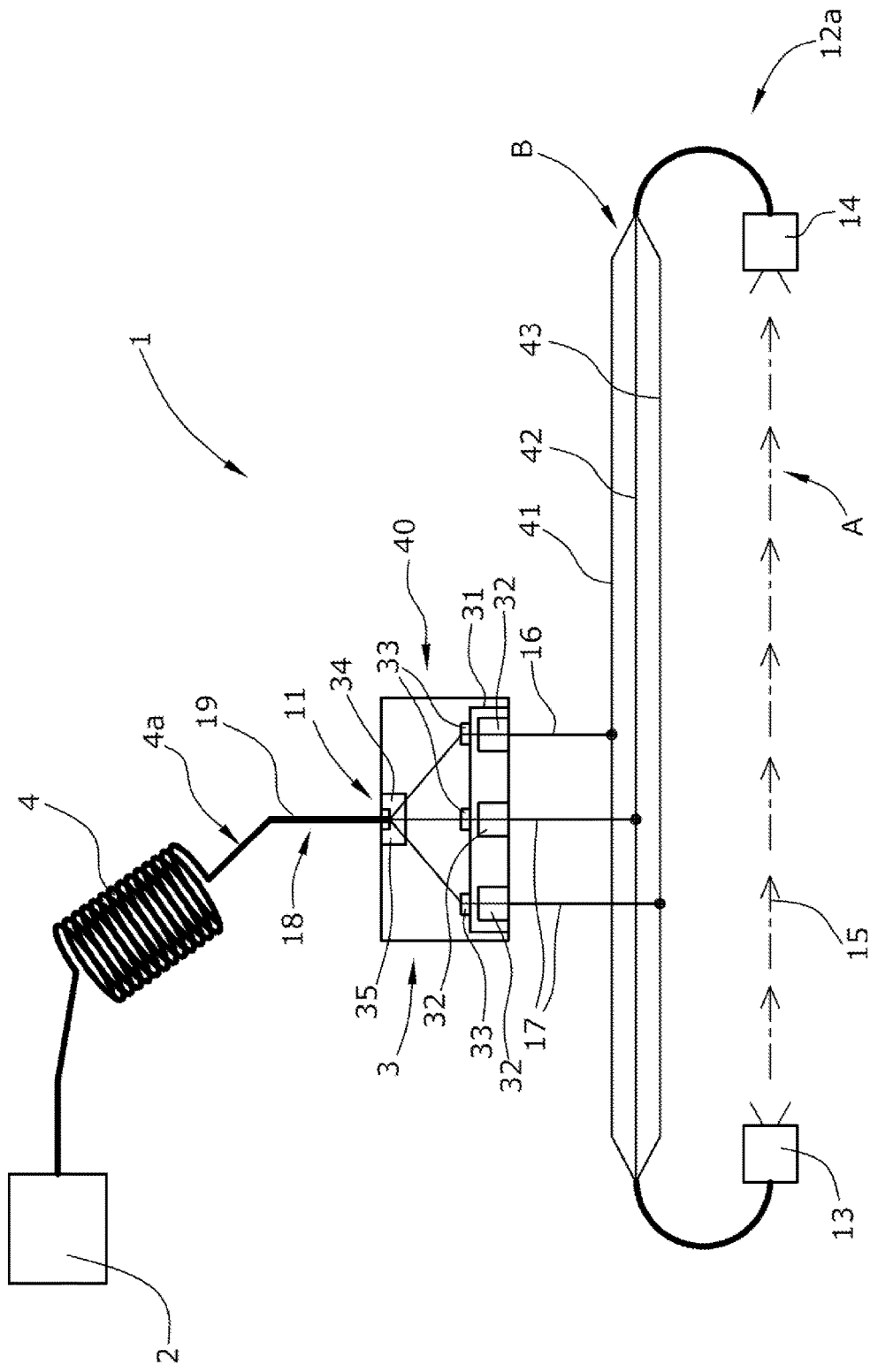
FIG. 1 shows a schematic illustration of an optoelectronic safety device of the present invention with a three-wire line.

In an embodiment of the present invention, a device is provided which is suitable to transmit the supply voltage and the control signal both via a two-wire electric line and, as an alternative, also via a three-wire electric line. It is thereby in particular possible to operate the safety device both with machine control devices with a two-pole terminal and with machine control devices with a three-pole terminal. The device, for example, a circuit arrangement, may in particular allow the transmission of a motor release signal as well as for the interconnection of an electric circuit for power supply, both via a two-wire line or via a three-wire line. This means that only one safety device system is required for both systems so that manufacturing and provisioning costs can be significantly reduced. The device is basically designed to be a part of the safety device, however, it is also possible to arrange the device at the machine control or on the cable.

In an embodiment of the present invention, the device can, for example, comprise a checking device adapted to automatically detect the presence of a two-wire electric line or a three-wire electric line at the safety device. The checking device can, for example, electronically or mechanically detect whether a two-wire line or a three-wire line is connected to the safety device. Detecting the respectively connected line may, for example, be effected by detecting the respective polarity of the operating voltage applied. The safety device can thereby automatically be put into a defined mode depending on the detected cable connected so that the assembly effort and the assembly costs are in particular reduced.

In an embodiment of the present invention, the checking device can, for example, include a wire detection device to detect a wire plugged into a connecting bush of the safety device. The detection may be electrical or mechanical, wherein, for example, when a wire is plugged into the connecting bush, an electric contact is closed in case an electric detection and/or a mechanical sensor is triggered in the case of a mechanical detection. The checking device can thus have a relatively simple structure and be economic.

In an embodiment of the present invention, the checking device can, for example, alternatively or additionally comprise a measuring device to detect a supply current consumption and/or to detect a supply voltage. The measuring device may in particular be a voltage measuring device to measure the given voltage. The checking device can thus electronically measure, for example, at a connecting bush of the safety device, whether a supply or operating voltage is present at the respective pole or at the respective wire or whether the pole or wire of the line is used only for signal transmission at a relatively low voltage. A detection of a two- or three-wire electric line can thus be performed in a particularly exact manner and without additional mechanical components. The checking device may thus be configured to have a relatively space-saving design.

In an embodiment of the present invention, the device can, for example, comprise a switching device adapted to automatically set a predetermined mode of the safety device by an internal circuitry depending on whether a two-wire line or a three-wire line is present. The switching device may (depending on whether a two-wire or a three-wire line is connected), for example, switch to a defined circuitry so that (depending on the application), the current supply to the safety device and an undisturbed transmission of the motor release signal are provided. The switching device may for this purpose comprise a plurality of field effect transistors, in particular a metal oxide semiconductor field effect transistor, which are mostly connected in combination. The switching device may in particular be arranged at the light emitter, at the light receiver, and/or at the evaluating device.

In an embodiment of the present invention, the device can, for example, comprise a modulating device adapted to modulate the motor release signal as a modulated signal onto a wire or core of the electric line which carries the supply voltage. The motor release signal can thereby be transmitted on the same wire as the electric circuit for the voltage supply of the safety device, in particular if a two-wire line is used, so that the design of the safety device is relatively economic.

In an embodiment of the present invention, for the purpose of transmitting the motor release signal and the supply voltage, the modulating device can, for example, be adapted to automatically set a predetermined output frequency of the safety device by adapting the voltage applied. The transmission of the motor release signal can thereby be effected in a particularly safe and reliable manner.

In an embodiment of the present invention, the modulating device can, for example, be adapted to set more than two different output frequencies. Different signals can thereby each be transmitted at a respective output frequency.

In an embodiment of the present invention, the setting of the output frequency can, for example, automatically be detected after the safety device is activated. It is thereby possible to provide a fully automatic, and in particularly a safe and reliable operation of the safety device.

In an embodiment of the present invention, setting the output frequency may also be checked at regular time intervals and be altered, if necessary, to further increase safety. Interferences caused by other frequencies can in particular be avoided in this manner The present invention will be described in more detail below with reference to the accompanying drawings.

FIG. 1 shows a schematic schematical drawing of an optoelectronic safety device 1 connected via a cable 4, 4a, 4b to a machine control 2 of a drive (not shown in the drawings) of a machine element (not shown in the drawings), in particular a movable gate.

For monitoring a danger zone, the optoelectronic safety device 1 comprises a light emitter 13 and a light receiver 14. A coupling loop exists between the light emitter 13 and the light receiver 14, wherein the coupling loop is formed by the optical safety signal 15, i.e., by a light path between the light emitter 13 and the light receiver 14, and by an electric, i.e., galvanic coupling lines 41, 42, 43. The galvanic coupling lines 41, 42, 43 are connected with the machine control 2 as a three-wire electric connection 4a via a control electronics/evaluating device 40. In the embodiment shown in FIG. 1, the first line 41 is used as a pure electric coupling line for signal transmission 16 of the optical safety signal 15, while the second line 42 and the third line 43 are used to transmit an operating voltage supply 17. In this embodiment of the optoelectronic safety device 1, a strict separation of the signal transmission 16 and the voltage supply 17 can thus be made.

The light emitter 13 and the light receiver 14 are connected in parallel to the control electronics/evaluating device 40 in which, among others, the signal transmission 16 transmitted on first line 41 is evaluated. In this regard, the control electronics/evaluating device 40 listens at the coupling loop at first line 41 between the light emitter 13 and the light receiver 14. An operating voltage for the operation of the optoelectronic safety device 1 is applied in the control electronics/evaluating device 40 at a further terminal of the second line 42 and the third line 43.

In the shown embodiment, the light emitter 13 emits pulsed infrared light which is detected by the light receiver 14. When detecting the optical safety signal 15 emitted, the light receiver 14 deactivates the light emitter 13 via the electric coupling connection of first line 41, whereby light emission is interrupted. After the light receiver 14 has also detected this state of the light emitter 13 by detecting no optical safety signal 15, the light emitter 13 is again activated by the light receiver 14 via the electric coupling of first line 41 after a certain delay. Due to the above described coupling between the light emitter 13 and the light receiver 14, a dynamic optical signal A is generated on the optical coupling line 15 and a dynamic electric signal B is generated on the electric coupling of first line 41. The dynamic electric signal B is detected by the control electronics/evaluating device 40 and, in response thereto, is outputted as a digital motor release signal 18 at the output 11 thereof, which output 11 can be provided as a connecting bush. For this purpose, it is checked, for example, whether a periodic squarewave signal is present on the electric coupling of first line 41. The periodic squarewave signal will be absent if the light path of the optical safety signal 15 is interrupted or if a malfunction occurs in one of the electric components such as the light emitter 13, the light receiver 14, or the galvanic coupling lines 41, 42, 43. If the periodic squarewave signal is absent from the electric coupling of first line 41, the control electronics/evaluating device 40, for example, outputs a voltage value 0 as the motor release signal 18, whereby the motor is controlled to stop or to reverse.

Figure 2:
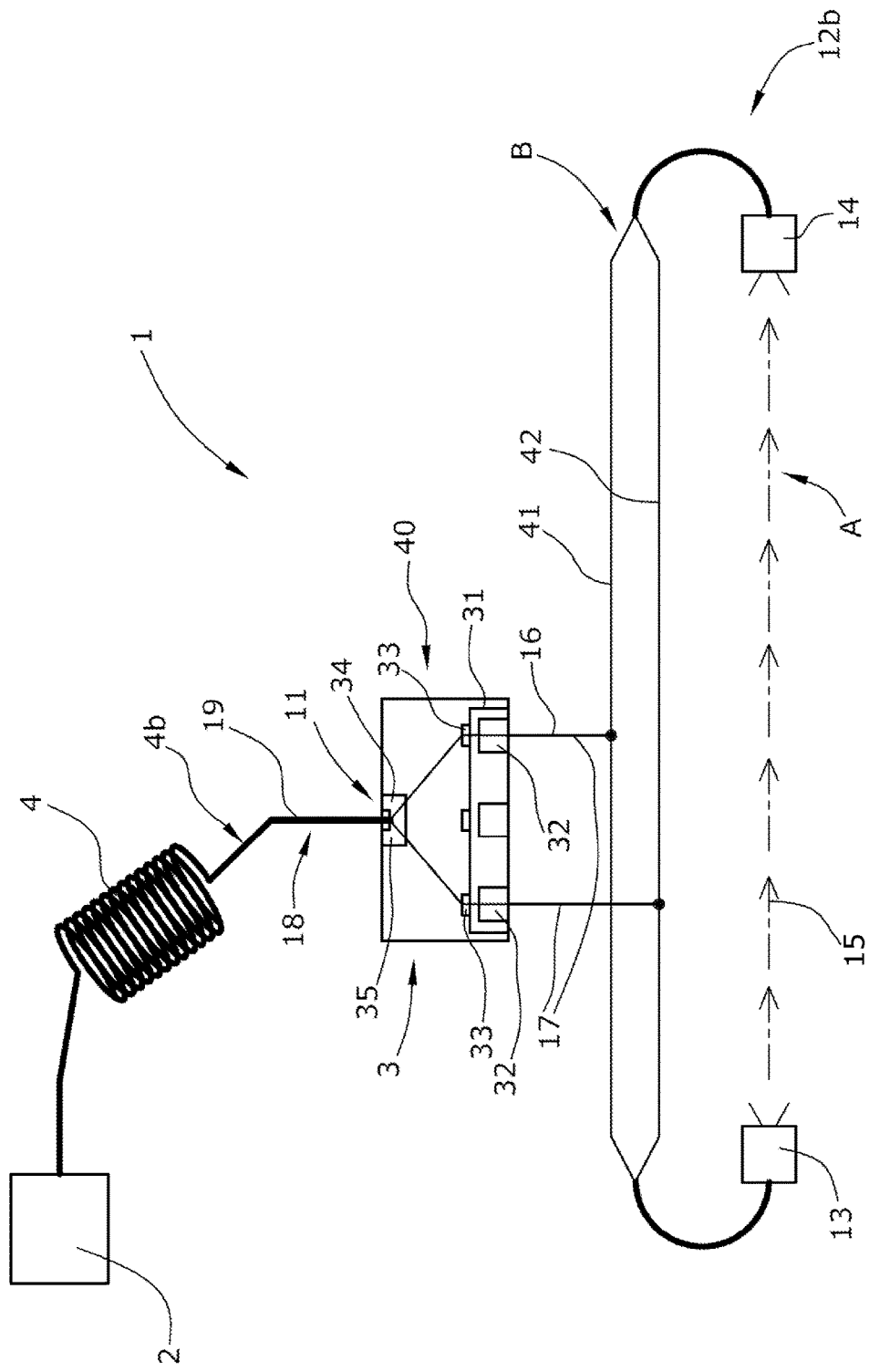
FIG. 2 shows a schematic illustration of the safety device of FIG. 1 with a two-wire line.

The optoelectronic safety device 1 of the present invention illustrated in FIGS. 1 and 2 may be operated both with a three-wire line electric connection 4a and a two-wire line electric connection 4b. This technical improvement is in particular advantageous with regard to manufacturing costs, since only a single type of optoelectronic safety device 1 must be produced and provisioned for various system requirements. This is advantageous specifically in a case of retrofitting or replacing, or generally with respect to connectivity with machine controls known per se and their connection possibilities.

For detecting whether a three-wire electric connection 4a (as shown in FIG. 1) or a two-wire line electric connection 4b (as shown in FIG. 2) is connected to the control electronics/evaluating device 40, the control electronics/evaluating device 40 comprises a device 3, for example, at a connecting bush of the galvanic coupling lines 41, 42, 43, which in the present case comprise a checking device 31, among others. The checking device 31 comprises a wire detection device 32 for mechanical wire detection as well as a measuring device 33 for electronic connection detection. In the wire detection device 32, a locking pin is depressed when a wire or a plug pin of the galvanic coupling lines 41, 42, 43 is inserted into a respective connecting bush of the control electronics/evaluating device 40, the depressing being detected by a sensor (not shown in the drawings). The sensor can, for example, constitute an electric circuit, the electric circuit being provided by pressing in the locking pin so as to provide an electric contact so that a flow of current can flow through the electric circuit and a voltage is detectable. It is thus possible to detect at each bush whether or not a wire is present in the respective bush of the control electronics/evaluating device 40. With an electron connection detection, it is possible to detect via the measuring device 33, for example, by measuring the voltage applied, a connected wire and its function, i.e., pure signal transmission, with only a relatively low voltage being applied, or voltage supply, with a relatively high voltage being applied, or signal transmission and voltage supply, in which case the voltage frequency and/or amplitude often vary. The measuring device 33 may, for example, be formed by a switching circuit (not shown in the drawings) having a microprocessor, a Zener diode and/or a transistor.

After the detection of the system type connected, the device 3 further comprises a switching device 34 for switching a mode 12a, 12b of the optoelectronic safety device 1 for the use of a three-wire line electric connection 4a or a two-wire line electric connection 4b. The optoelectronic safety device 1 can in particular be operated in a first mode 12a when a three-wire line forms the connection to the machine control 2, and in a second mode 12b when a two-wire line forms the connection to the machine control 2. The switching device 34 in particular serves to read out and evaluate the optical safety signal 15 for a correct evaluation and transmission and/or to modulate the signal onto a galvanic coupling line 41, 42, 43 for a voltage supply. The switching device 34 can, for example, comprise one or a plurality of field effect transistors arranged at the light emitter 13, the light receiver 14 and/or the control electronics/evaluating device 40.

A modulating device 35 is provided for the modulation of a signal already mentioned above. The modulating device 35 is suited, specifically if a two-wire line electric connection 4b is used, in particular to modulate a motor release signal 18 onto the transmission signal of a galvanic coupling line 41, 42, 43 that is also used for voltage supply. The modulating device 35 is suited to set a predefined output frequency 19 by adapting the supply voltage 17 on the galvanic coupling line 41, 42, 43 for this purpose. This output frequency 19 may vary and, as a measure of safety, is automatically checked at regular time intervals and is changed, if necessary. The modulation device 35 may, for example, be formed by a switching circuit (not shown in the drawings) having a transistor, a diode, a thyristor and/or a relay. The switching device 34 and the modulating device 35 thus process the signals in particular depending on the result on the connected poles or galvanic coupling lines 41, 42, 43 obtained by the checking device 31.

It should be clear that the embodiments illustrated in FIGS. 1 and 2 are shown in a purely schematical manner and that any arrangement of the components, such as the checking device 31, the measuring device 33, and/or the switching device 34, is possible. These components are in particular not limited with respect to number, choice or arrangement. Reference should be had to the appended claims.

LIST OF REFERENCE NUMERALS 1 optoelectronic safety device, optoelectronic safety edge
11 output, connecting bush
12a first mode
12b second mode
13 light emitter
14 light receiver
15 optical safety signal, detection signal
16 safety signal, signal transmission
17 supply voltage
18 motor release signal, control signal
19 output frequency
2 machine control
3 device
31 checking device
32 wire detection device
33 measuring device
34 switching device
35 modulating device
4 connecting line, cable
4a three-wire line, electric connection
4b two-wire line, electric connection
40 control electronics/evaluating device
41 first wire, first line, galvanic coupling line
42 second wire, second line, galvanic coupling line
43 third wire, third line, galvanic coupling line
A dynamic optical signal
B dynamic optical signal

What is claimed is:

1. An optoelectronic safety device for monitoring a machine movement comprising:
   an emitter/receiver device;
   control electronics;
   an electric line comprising at least two wires configured to transmit a supply voltage and a control signal;
   a device configured so that the supply voltage and the control signal can be transmitted where the at least two wires comprises a two-wire electric line and where the at least two wires comprises a three-wire electric line;
a checking device configured to detect a presence of the two-wire electric line and the three-wire electric line; and
a switching device comprising internal circuitry, the switching device being configured to automatically set a predetermined mode of the optoelectronic safety device via the internal circuitry depending on whether the two-wire electric line or the three-wire electric line is provided.

2. The optoelectronic safety device as recited in claim 1, further comprising:
a connection; and
a wire of two-wire electric line or of the three-wire electric line which is plugged into the connection,
wherein,
the checking device comprises a wire detection device configured to detect whether the wire is plugged into the connection of the safety device.

3. The optoelectronic safety device as recited in claim 1, wherein the checking device further comprises a measuring device configured to detect at least one of a supply current consumption and the supply voltage.

4. The optoelectronic safety device as recited in claim 1, wherein the device comprises a modulating device configured to modulate the control signal as a modulated signal onto a wire of the two-wire electric line or the three-wire electric line which transmits the supply voltage.

5. The optoelectronic safety device as recited in claim 4, wherein, for the purpose of transmitting the control signal and the supply voltage, the modulating device is configured to automatically set a predetermined output frequency of the safety device by adapting the voltage applied.

6. The optoelectronic safety device as recited in claim 5, wherein the setting of the predetermined output frequency is automatically detected after an activation of the safety device.

7. The optoelectronic safety device as recited in claim 5, wherein the setting of the predetermined output frequency is checked at regular time intervals.

8. The optoelectronic safety device as recited in claim 7, wherein the setting of the predetermined output frequency is altered if necessary.

9. The optoelectronic safety device of claim 5, wherein the modulating device is further configured to set more than two different predetermined output frequencies.

10. The optoelectronic safety device as recited in claim 9, wherein the setting of the more than two predetermined output frequencies is automatically detected after an activation of the safety device.

\* \* \* \* \*